(12) United States Patent
Shin et al.

(10) Patent No.: US 9,725,305 B2
(45) Date of Patent: Aug. 8, 2017

(54) DUAL CAVITY PRESSURE STRUCTURES

(71) Applicant: InvenSense, Inc., San Jose, CA (US)

(72) Inventors: Jong Il Shin, San Jose, CA (US); Peter Smeys, San Jose, CA (US); Daesung Lee, Palo Alto, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 15/071,499

(22) Filed: Mar. 16, 2016

(65) Prior Publication Data

US 2016/0272486 A1 Sep. 22, 2016

Related U.S. Application Data

(60) Provisional application No. 62/134,455, filed on Mar. 17, 2015.

(51) Int. Cl.
*H01L 21/302* (2006.01)
*B81C 1/00* (2006.01)
*B81B 7/02* (2006.01)

(52) U.S. Cl.
CPC ............ *B81B 7/02* (2013.01); *B81C 1/00214* (2013.01); *B81B 2201/0235* (2013.01); *B81B 2201/0242* (2013.01); *B81B 2207/012* (2013.01); *B81C 2203/0118* (2013.01); *B81C 2203/035* (2013.01)

(58) Field of Classification Search
CPC ... H01L 21/302; H01L 27/14618; B81B 7/02; B81C 1/00214
See application file for complete search history.

(56) References Cited

U.S. PATENT DOCUMENTS

| | | | |
|---|---|---|---|
| 7,442,570 B2 | 10/2008 | Nasiri et al. | |
| 2012/0326248 A1 | 12/2012 | Daneman et al. | |
| 2015/0129991 A1 | 5/2015 | Lee et al. | |
| 2015/0158720 A1 | 6/2015 | Lim et al. | |
| 2015/0360939 A1 | 12/2015 | Zhang et al. | |

OTHER PUBLICATIONS

Zhang, Carrie, Method for providing a MEMS device with a plurality of sealed enclosures and MEMS device, U.S. Appl. No. 14/857,687 (Unpublished U.S. Patent Application).

*Primary Examiner* — Thanh V Pham (57) ABSTRACT

Provided herein is a method including forming a trench in a handle substrate, and a trench lining is formed in the trench. A first cavity and a second cavity are formed in the handle substrate, wherein the first cavity is connected to the trench. A first MEMS structure and the handle substrate are sealed for maintaining a first pressure within the trench and the first cavity. A second MEMS structure and the handle substrate are sealed for maintaining the first pressure within the second cavity. A portion of the trench lining is exposed, and the first pressure is changed to a second pressure within the first cavity. The first cavity and the trench are sealed to maintain the second pressure within the trench and the first cavity.

16 Claims, 10 Drawing Sheets

DUAL CAVITY PRESSURE STRUCTURES

CROSS-REFERENCE TO RELATED APPLICATIONS

This application claims the benefit of U.S. Provisional Patent Application Ser. No. 62/134,455 filed Mar. 17, 2015, entitled "DUAL CAVITY PRESSURE SCHEMES".

BACKGROUND

MEMS ("micro-electro-mechanical systems") are a class of devices that are fabricated using semiconductor-like processes and exhibit mechanical characteristics. For example MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. During fabrication, it may be desirable to create various different MEMS devices on the same wafer. Furthermore, it may be desirable to form the various different MEMS devices with different internal pressures.

SUMMARY

Provided herein is a method including forming a trench in a handle substrate, and a trench lining is formed in the trench. A first cavity and a second cavity are formed in the handle substrate, wherein the first cavity is connected to the trench. A first MEMS structure and the handle substrate are sealed for maintaining a first pressure within the trench and the first cavity. A second MEMS structure and the handle substrate are sealed for maintaining the first pressure within the second cavity. A portion of the trench lining is exposed, and the first pressure is changed to a second pressure within the first cavity. The first cavity and the trench are sealed to maintain the second pressure within the trench and the first cavity.

These and other features and aspects of the concepts described herein may be better understood with reference to the following drawings, description, and appended claims.

DESCRIPTION

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

MEMS devices may include mechanical elements that work best when sealed in specific predetermined pressures. For example, a gyroscope MEMS device optimally operates at a lower pressure than an accelerometer MEMS device, which optimally operates at a higher pressure. Furthermore, some MEMS devices operate within different environments. For example, some MEMS devices may need a helium environment, while other MEMS devices may need a hydrogen environment. During fabrication, it may be desirable to create various different MEMS devices with different pressures and/or environments on the same wafer. Embodiments disclose methods for fabricating MEMS devices with different pressures and/or environments on the same wafer, as well as the novel characteristics of the MEMS devices fabricated by the disclosed embodiments.

Figure 1:
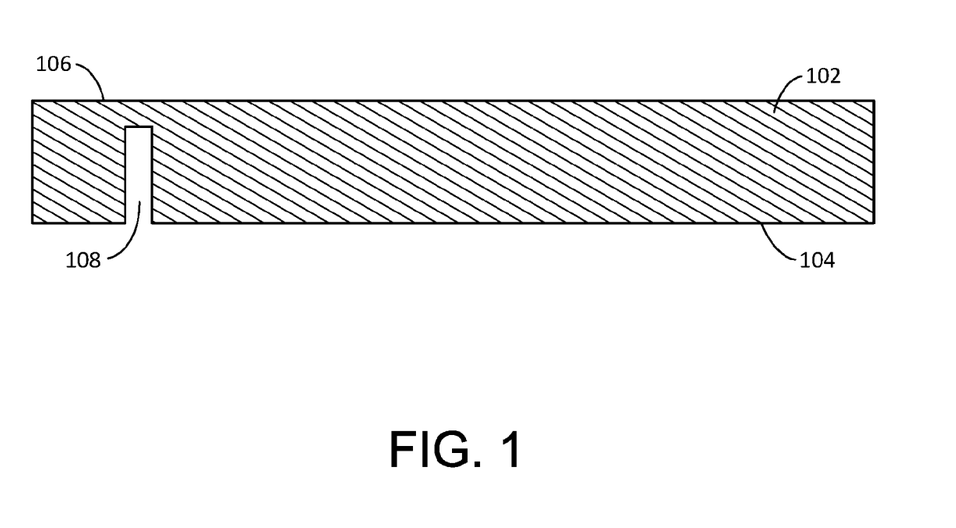
FIG. 1 shows a first substrate including a trench according to one aspect of the present embodiments.

Referring now to FIG. 1, a first substrate including a trench is shown according to one aspect of the present embodiments. A first substrate 102 is provided. The first substrate 102 may be, for example, a silicon wafer, however it is understood that embodiments are not limited to silicon wafers. The first substrate 102 includes a first side 104 and a second side 106. A trench 108 is formed in the first side 104 of the first substrate 102 by any suitable fabrication method (e.g. etching, cutting, laser ablation, etc.). The trench 108 may also be referred to as a chimney, and in various embodiments the trench 108 is a high aspect ratio trench (e.g. ≤70:1). In some embodiments the width of the trench 108 is 2 to 4 microns, and the length of the trench 108 is not limited. In various embodiments at this stage of fabrication, the trench 108 does not extend from the first side 104 entirely to the second side 106 (e.g. the trench 108 stops before reaching the second side 106).

Figure 2:
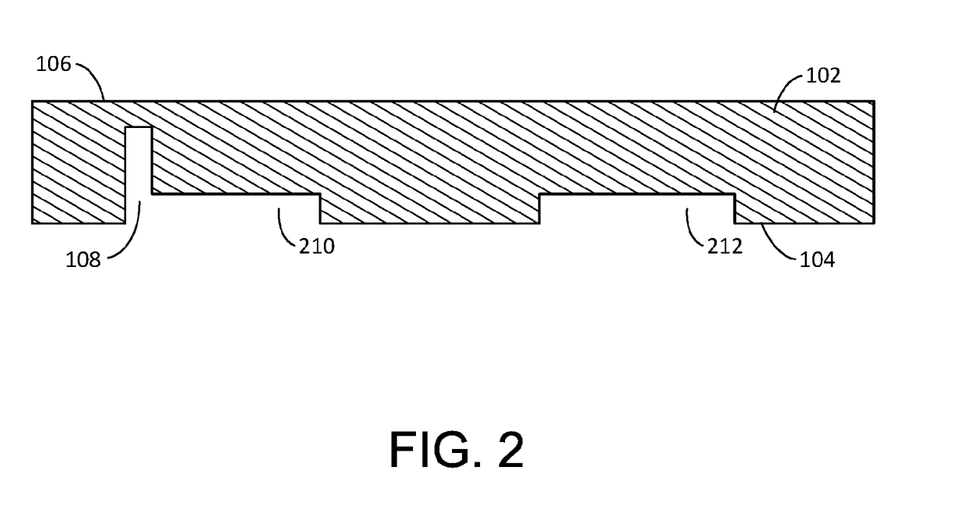
FIG. 2 shows the substrate with the addition of cavities according to one aspect of the present embodiments.

Referring now to FIG. 2, the substrate with the addition of cavities is shown according to one aspect of the present embodiments. A first cavity 210 and a second cavity 212 (also referred to as upper cavities) are formed in the first side 104 of the first substrate 102 by any suitable fabrication method (e.g. etching, cutting, laser ablation, etc.). The first cavity 210 is connected to the trench 108, and the trench 108 is positioned such that it is not over the moveable portion of the MEMS structure in order to minimize process impact on the moveable structure. The second cavity 212 does not include a trench structure.

It is understood that for simplicity of illustration only two cavities are shown, but any number of cavities and trenches may be fabricated on a substrate. In addition, the patterns on the substrate are not limited. For example, cavities without trenches may be next to each other, and cavities with trenches may be next to each other.

In various embodiments, the trench 108 and the first cavity 210 share a common and fluidly connected open space, such that the trench 108 opens directly down into the first cavity 210. In the illustrated embodiment, the trench 108 shares a left side wall with the first cavity 210. However, it is understood that the trench 108 may be on either side of the first cavity 210. Furthermore in some embodiments, the trench 108 may be positioned in any offset location above the first cavity 210 that is not directly above a MEMS structure (not shown, but see FIG. 5).

Figure 3:
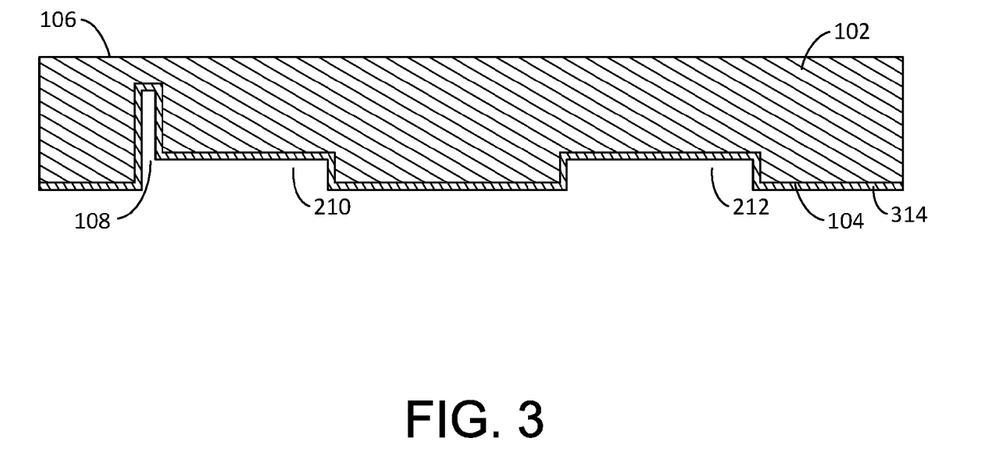
FIG. 3 shows a thermal oxide growth on the trench and the cavities according to one aspect of the present embodiments.

Referring now to FIG. 3, a thermal oxide growth on the trench and the cavities is shown according to one aspect of the present embodiments. A lining 314 is formed over the first side 104 using any suitable fabrication method (e.g. deposition, growth, sputtering, etc.). For example, the lining may be a thermal oxide growth (e.g. silicon dioxide). The lining 314 covers the first side 104, the trench 108, the first cavity 210, and the second cavity 212. In various embodiments, the lining 314 may be used to set or reduce the width of the trench 108 to a predetermined width. For example, the width of the trench 108 after the formation of the lining may be 0.5 to 2.0 microns. In some embodiments, the narrowing of the width of the trench 108 improves the sealing of the trench (not shown, but see FIG. 7).

Figure 4:
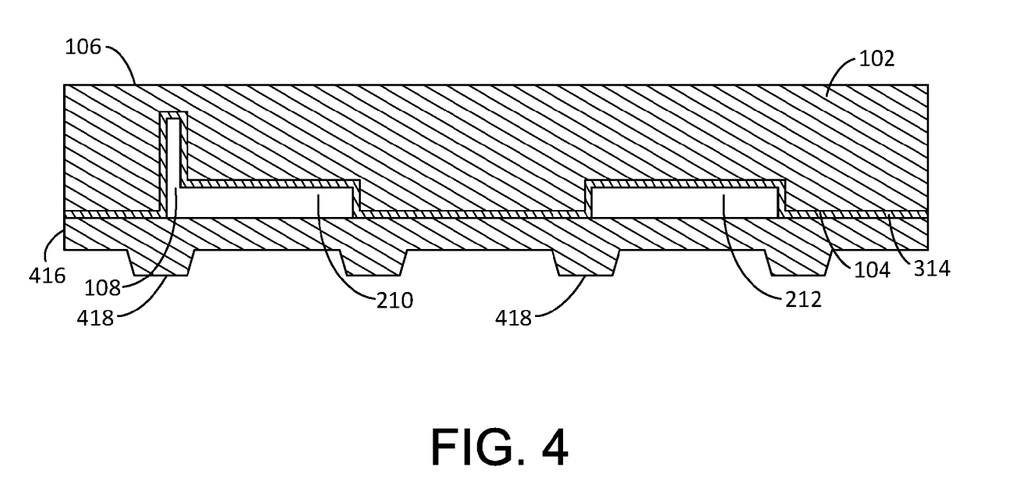
FIG. 4 shows the first substrate fusion bonded to a second substrate including standoffs according to one aspect of the present embodiments.

Referring now to FIG. 4, the first substrate fusion bonded to a second substrate including standoffs is shown according to one aspect of the present embodiments. A second substrate 416 is bonded to the first substrate 102. For example, the second substrate 416 may be fusion bonded to the first substrate 102, thereby forming a silicon oxide silicon bond. In various embodiments, the second substrate 416 is a structural layer including silicon with MEMS features (e.g. bump stop, damping hole, via, port, plate, proof mass, standoff, spring, seal ring, proof mass, etc.). The MEMS features (not shown, but see FIG. 5) may include one or more moveable elements.

In various embodiments, the first substrate 102 is a MEMS substrate. The MEMS substrate (first substrate 102) provides mechanical support for the structural layer (second substrate 416). The MEMS substrate may also be referred to as a handle substrate or handle wafer. In some embodiments, the handle substrate serves as a cap to the structural layer (e.g. forming the first cavity 210 and the second cavity 212), and may be referred to as a cap layer.

In some embodiments, standoffs 418 are patterned on the second substrate 416. The standoffs 418 define the vertical clearance between the structural layer and an IC substrate (not shown, but see FIG. 5). The standoffs 418 may also provide electrical contact between the structural layer and the IC substrate.

Figure 5:
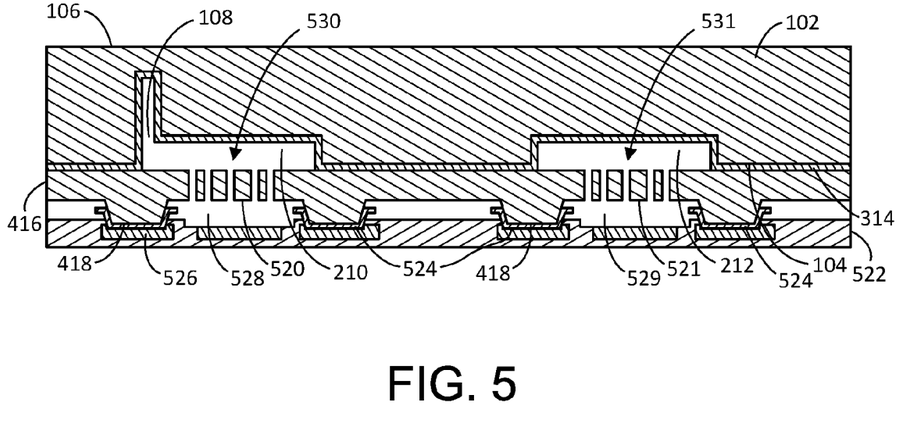
FIG. 5 shows the formation of MEMS features and eutectic bonding of the second substrate to a third substrate according to one aspect of the present embodiments.

Referring now to FIG. 5, the formation of MEMS features and eutectic bonding of the second substrate to a third substrate is shown according to one aspect of the present embodiments. First MEMS features 520 and second MEMS features 521 have been formed in the second substrate 416 using any suitable fabrication method. Fabrication methods may include, but are not limited to, etching, cutting, laser ablation, deposition, growth, sputtering, etc.

In addition, the second substrate 416 has been bonded to an additional substrate (e.g. a third substrate 522). For example, in some embodiments the standoffs 418 form a eutectic bond 524 with bond pads 526 on the third substrate 522, thereby providing an electrical connection between the second and third substrates. In various embodiments, the eutectic bond 524 is an aluminum-germanium (AlGe) bond as described in U.S. Pat. No. 7,442,570, the contents of which are incorporated by reference. In other embodiments, the eutectic bond can be formed by tin-copper, tin-aluminum, gold-germanium, gold-tin, or gold-indium. In some embodiments, the third substrate 522 is an integrated circuit ("IC") substrate. An IC substrate may refer to a silicon substrate with electrical circuits, for example CMOS ("complementary metal-oxide semiconductor") electrical circuits.

In some embodiments, the standoffs 418 and the third substrate 522 define a first lower cavity 528 and a second lower cavity 529. The standoffs 418 and the eutectic bond 524 provide a seal that defines a first enclosure 530 and a second enclosure 531. In various embodiments, the enclosure may refer to a fully enclosed volume typically surrounding the MEMS structure and typically formed by the IC substrate, structural layer, MEMS substrate, and the standoff seal ring. For example in the illustrated embodiment, the first enclosure 530 refers to the fully enclosed volume surrounding the first MEMS features 520, including the first cavity 210 and the first lower cavity 528. In addition, the second enclosure 531 refers to the fully enclosed volume surrounding the second MEMS features 521, including the second cavity 212 and the second lower cavity 529. In further embodiments, the eutectic bond 524 may be substituted with other forms of bonding (e.g. solder, adhesive, etc.). In some embodiments, the seal may be a hermetic seal.

Before bonding the second substrate 416 and the third substrate 522, thereby sealing the first enclosure 530 and the second enclosure 531, the pressure and/or environment may be set to a predetermined state. For example, the chamber in which the bonding is being performed may be adjusted to increase or decrease the ambient pressure, thereby causing the pressure in the first enclosure 530 and the second enclosure 531 to match the altered ambient pressure. Likewise, the chamber in which the bonding is being performed may be adjusted to increase or decrease levels of gas (e.g. helium, hydrogen, nitrogen, etc.), thereby causing the gas levels in the first enclosure 530 and the second enclosure 531 to match the altered ambient gas composition. After the gas has been adjusted, the first enclosure 530 and the second enclosure 531 are sealed, thus trapping the gas pressure and composition within.

Figure 6:
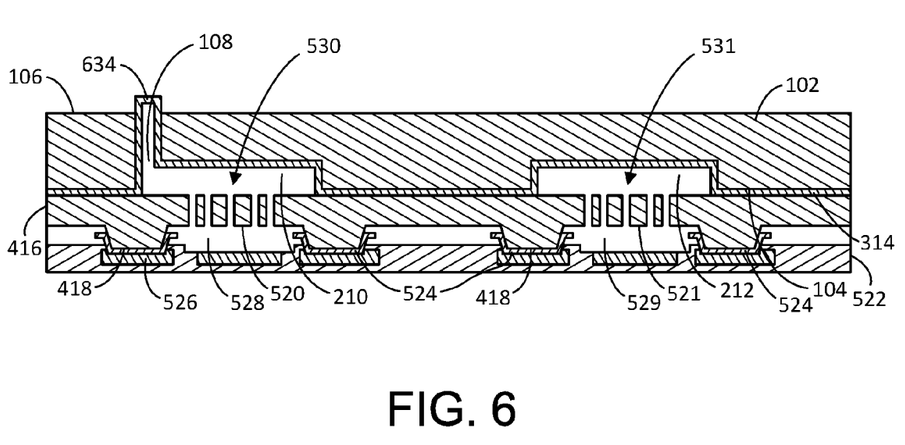
FIG. 6 shows removal of a portion of the first substrate to reveal the trench and adjust the pressure in one cavity according to one aspect of the present embodiments.

Referring now to FIG. 6, removal of a portion of the first substrate to reveal the trench and adjust the pressure in one cavity is shown according to one aspect of the present embodiments. A portion of the second side 106 of the first substrate 102 is removed to open the trench 108 and expose a portion 634 of the lining 314. Removal of the portion of the second side may be done through any suitable method (e.g. etching, cutting, polishing, grinding, etc.). It is understood that the removal of the portion of the second side 106 is controlled to expose the portion 634 of the lining 314 in the trench 108, while not exposing the lining 314 in the second enclosure 531. Thus, the second enclosure 531 remains sealed.

In the present embodiment, the portion 634 of the lining 314 is permeable to various gasses. In some embodiments, the portion 634 of the lining 314 is permeable to all gasses. In further embodiments, the portion 634 of the lining 314 is permeable to only one or only a few gasses (e.g. helium and/or hydrogen).

As a result of the permeability of the portion 634 of the lining 314, the pressure and/or environment within the first enclosure 530 may be adjusted to a second predetermined state. For example, the chamber in which the post processing is being performed may be adjusted to increase or decrease the ambient pressure, thereby causing the pressure in the first enclosure 530 to match the altered ambient pressure. Likewise, the chamber in which the post processing is being performed may be adjusted to increase or decrease levels of gas (e.g. helium, hydrogen, etc.), thereby causing the gas levels in the first enclosure 530 to match the altered ambient gas composition.

While the environment within the first enclosure 530 is being adjusted, the second enclosure 531 remains sealed. As a result, different MEMS devices with different internal environments may be created on the same MEMS wafer. Some of the advantages include reducing process steps, speeding up fabrication, and allowing different MEMS devices to be more closely integrated. For example, an accelerometer may optimally function in a higher pressure environment. In addition, a gyroscope may optimally function in lower pressure environments. Embodiments allow fabrication of both the accelerometer and the gyroscope using shared process steps.

Figure 7:
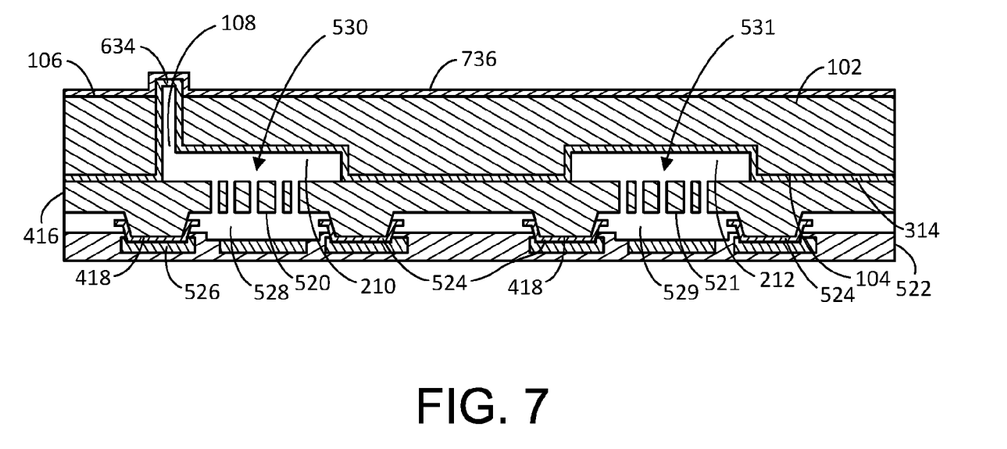
FIG. 7 shows the addition of a seal to set the adjusted pressure of the trench cavity according to one aspect of the present embodiments.

Referring now to FIG. 7, the addition of a seal to set the adjusted pressure of the trench cavity is shown according to one aspect of the present embodiments. A seal layer 736 is formed over the second side 106 of the first substrate 102 using any suitable fabrication method (e.g. deposition, growth, sputtering, etc.). The seal layer 736 covers the portion 634 of the lining 314, thereby sealing the trench 108 and the first enclosure 530. For example, a metal layer (e.g. Al or AlCu) may be deposited by physical vapor deposition on the second side 106 of the substrate 102. The metal layer traps the gas within the trench 108 and the first enclosure 530, thereby locking in the environment surrounding the corresponding MEMS device. In various embodiments, the seal layer 736 hermetically seals the trench 108 and the first enclosure 530.

In the illustrated embodiment, the seal layer 736 covers the entire second side 106 of the first substrate 102. However in some embodiments, the seal layer 736 may cover only portions of the second side 106. For example, the seal layer 736 may only cover the portion 634 of the lining 314 and an area of the second side 106 surrounding the seal layer 736. Thus the seal layer 736 may be selectively applied in discrete areas to seal the trench 108 and the first enclosure 530.

As previously stated, the arrangement of enclosures with and without trenches is not limited. As a result, a number of combinations of MEMS devices may be fabricated using the described embodiments. For example, MEMS devices requiring a first environment may be fabricated directly next to each other, or they may be separated by one or more MEMS devices requiring a second environment. Thus, many different combinations of MEMS devices may be fabricated, and should not be limited by the embodiments described herein.

Figure 8:
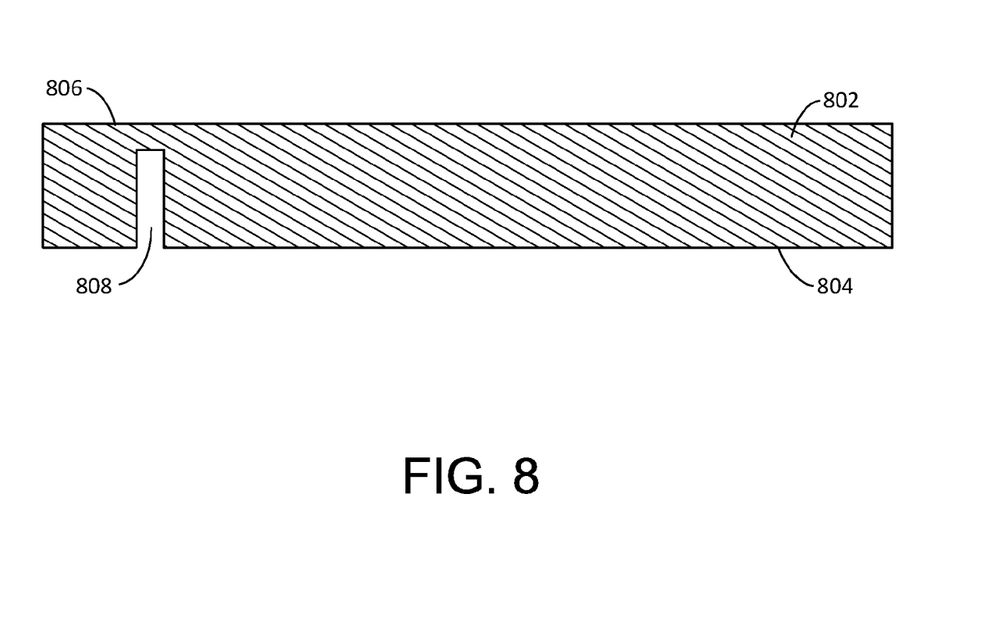
FIG. 8 shows a first substrate including a trench according to one aspect of the present embodiments.

Referring now to FIG. 8, a first substrate including a trench is shown according to one aspect of the present embodiments. A first substrate 802 is provided. The first substrate 802 may be, for example, a silicon wafer, however it is understood that embodiments are not limited to silicon wafers. The first substrate 802 includes a first side 804 and a second side 806. A trench 808 is formed in the first side 804 of the first substrate 802 by any suitable fabrication method (e.g. etching, cutting, laser ablation, etc.). The trench 808 may also be referred to as a chimney, and in various embodiments the trench 808 is a high aspect ratio trench (e.g. ≤70:1). In some embodiments the width of the trench 808 is 2 to 4 microns, and the length of the trench 808 is not limited. In various embodiments at this stage of fabrication, the trench 808 does not extend from the first side 804 entirely to the second side 806 (e.g. the trench 808 stops before reaching the second side 806).

Figure 9:
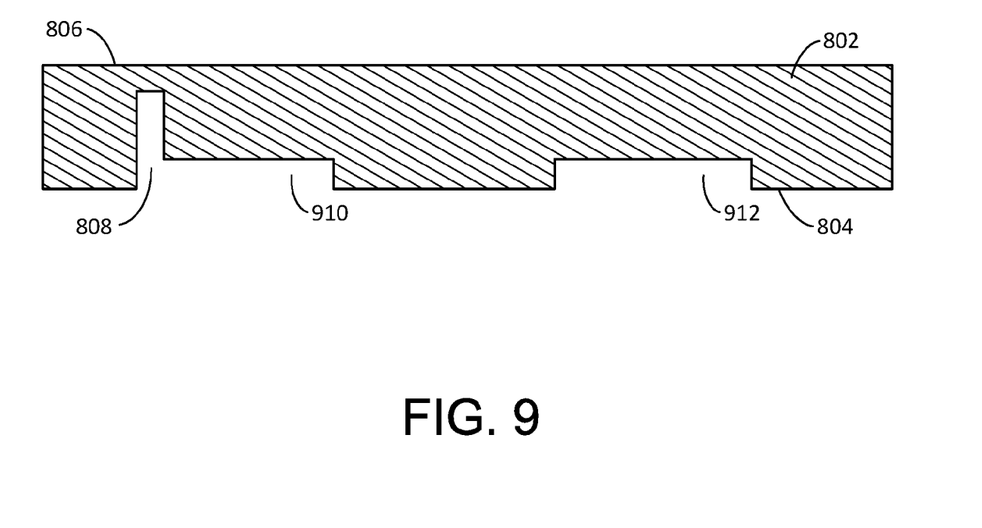
FIG. 9 shows the substrate with the addition of cavities according to one aspect of the present embodiments.

Referring now to FIG. 9, the substrate with the addition of cavities is shown according to one aspect of the present embodiments. A first cavity 910 and a second cavity 912 (also referred to as upper cavities) are formed in the first side 804 of the first substrate 802 by any suitable fabrication method (e.g. etching, cutting, laser ablation, etc.). The first cavity 910 is connected to the trench 808 and the first cavity 910. It is understood that it can also be stated that the trench 808 is located within the first cavity 910. As such, the trench 808 is positioned such that it is not over the moveable structure of the first cavity 910. The second cavity 912 does not include a trench structure.

It is understood that for simplicity of illustration only two cavities are shown, but any number of cavities and trenches may be fabricated on a substrate. In addition, the patterns on the substrate are not limited. For example, cavities without trenches may be next to each other, and cavities with trenches may be next to each other.

In various embodiments, the trench 808 and the first cavity 910 share a common and fluidly connected open space, such that the trench 808 opens directly down into the first cavity 910. In the illustrated embodiment, the trench 808 shares a left side wall with the first cavity 910. However, it is understood that the trench 808 may be on either side of the first cavity 910. Furthermore in some embodiments, the trench 808 may be positioned in any offset location above the first cavity 910 that is not directly above a MEMS structure (not shown, but see FIG. 5).

Figure 10:
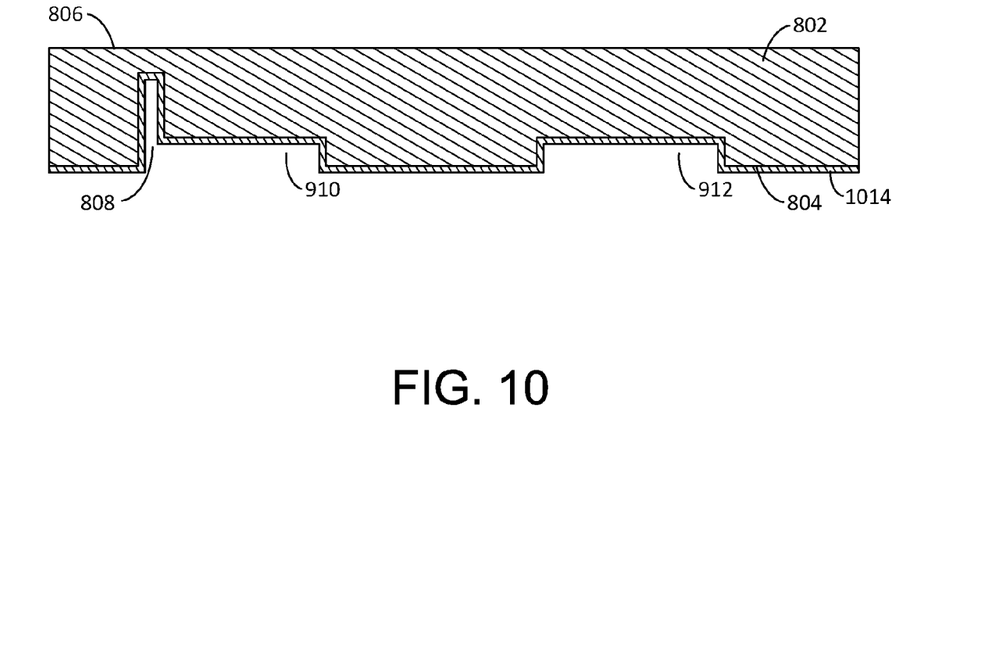
FIG. 10 shows a thermal oxide growth on the trench and the cavities according to one aspect of the present embodiments.

Referring now to FIG. 10, a thermal oxide growth on the trench and the cavities is shown according to one aspect of the present embodiments. A lining 1014 is formed over the first side 804 using any suitable fabrication method (e.g. deposition, growth, sputtering, etc.). For example, the lining may be a thermal oxide growth (e.g. silicon dioxide). The lining 1014 covers the first side 804, the trench 808, the first cavity 910, and the second cavity 912. In various embodiments, the lining 1014 may be used to set or reduce the width of the trench 808 to a predetermined width. For example, the width of the trench 808 after the formation of the lining may be 0.5 to 2.0 microns. In some embodiments, the narrowing of the width of the trench 808 improves the sealing of the trench (not shown, but see FIG. 15).

Figure 11:
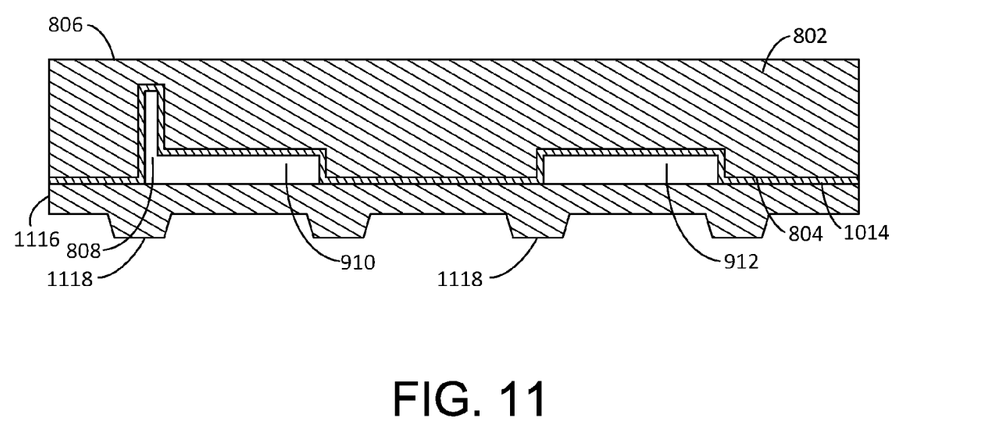
FIG. 11 shows the first substrate fusion bonded to a second substrate including standoffs according to one aspect of the present embodiments.

Referring now to FIG. 11, the first substrate fusion bonded to a second substrate including standoffs is shown according to one aspect of the present embodiments. A second substrate 1116 is bonded to the first substrate 802. For example, the second substrate 1116 may be fusion bonded to the first substrate 802, thereby forming a silicon oxide silicon bond. In various embodiments, the second substrate 1116 is a structural layer including silicon with MEMS features (e.g. bump stop, damping hole, via, port, plate, proof mass, standoff, spring, seal ring, proof mass, etc.). The MEMS features (not shown, but see FIG. 12) may include one or more moveable elements.

In various embodiments, the first substrate 802 is a MEMS substrate. The MEMS substrate (first substrate 802) provides mechanical support for the structural layer (second substrate 1116). The MEMS substrate may also be referred to as a handle substrate or handle wafer. In some embodiments, the handle substrate serves as a cap to the structural layer (e.g. forming the first cavity 910 and the second cavity 912), and may be referred to as a cap layer.

In some embodiments, standoffs 1118 are patterned on the second substrate 1116. The standoffs 1118 define the vertical clearance between the structural layer and an IC substrate (not shown, but see FIG. 12). The standoffs 1118 may also provide electrical contact between the structural layer and the IC substrate.

Figure 12:
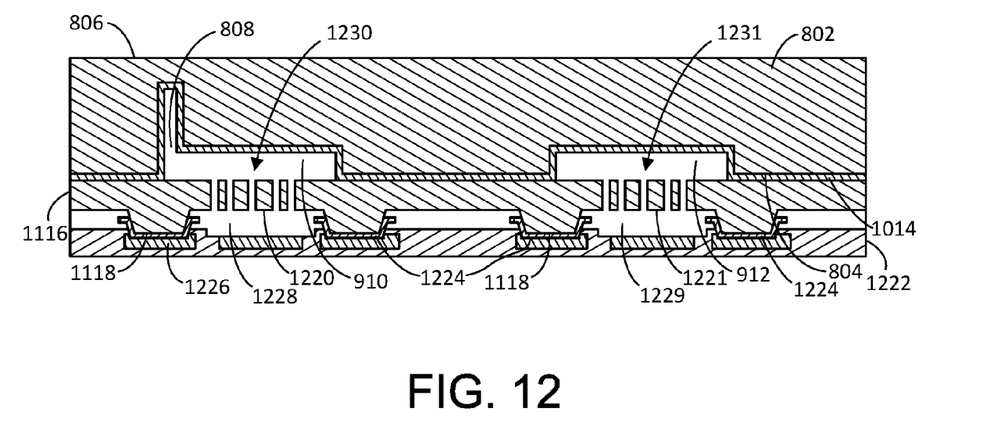
FIG. 12 shows the formation of MEMS features and eutectic bonding of the second substrate to a third substrate according to one aspect of the present embodiments.

Referring now to FIG. 12, the formation of MEMS features and eutectic bonding of the second substrate to a third substrate is shown according to one aspect of the present embodiments. First MEMS features 1220 and second MEMS features 1221 have been formed in the second substrate 1116 using any suitable fabrication method. Fabrication methods may include, but are not limited to, etching, cutting, laser ablation, deposition, growth, sputtering, etc.

In addition, the second substrate 1116 has been bonded to a third substrate 1222 (e.g. an additional substrate). For example, in some embodiments the standoffs 1118 form a eutectic bond 1224 with bond pads 1226 on the third substrate 1222, thereby providing an electrical connection between the second and third substrates. In various embodiments, the eutectic bond 1224 is an aluminum-germanium (AlGe) bond. In some embodiments, the third substrate 1222 is an integrated circuit ("IC") substrate. An IC substrate may refer to a silicon substrate with electrical circuits, for example CMOS ("complementary metal-oxide semiconductor") electrical circuits.

In some embodiments, the standoffs 1118 and the third substrate 1222 define a first lower cavity 1228 and a second lower cavity 1229. The standoffs 1118 and the eutectic bond 1224 provide a seal that defines a first enclosure 1230 and a second enclosure 1231. In various embodiments, the enclosure may refer to a fully enclosed volume typically surrounding the MEMS structure and typically formed by the IC substrate, structural layer, MEMS substrate, and the standoff seal ring. For example in the illustrated embodiment, the first enclosure 1230 refers to the fully enclosed volume surrounding the first MEMS features 1220, including the first cavity 910 and the first lower cavity 1228. In addition, the second enclosure 1231 refers to the fully enclosed volume surrounding the second MEMS features 1221, including the second cavity 912 and the second lower cavity 1229. In further embodiments, the eutectic bond 1224 may be substituted with other forms of bonding (e.g. solder, adhesive, etc.). In some embodiments, the seal may be a hermetic seal.

Before bonding the second substrate 1116 and the third substrate 1222, thereby sealing the first enclosure 1230 and the second enclosure 1231, the pressure and/or environment may be set to a predetermined state. For example, the chamber in which the bonding is being performed may be adjusted to increase or decrease the ambient pressure, thereby causing the pressure in the first enclosure 1230 and the second enclosure 1231 to match the altered ambient pressure. Likewise, the chamber in which the bonding is being performed may be adjusted to increase or decrease levels of gas (e.g. helium, hydrogen, nitrogen, etc.), thereby causing the gas levels in the first enclosure 1230 and the second enclosure 1231 to match the altered ambient gas composition. After the gas has been adjusted, the first enclosure 1230 and the second enclosure 1231 are sealed, thus trapping the gas pressure and composition within.

Figure 13:
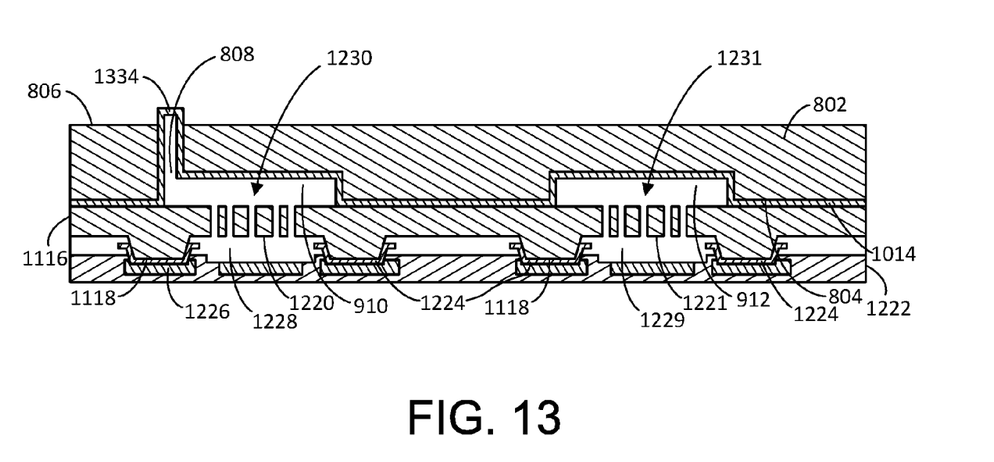
FIG. 13 shows removal of a portion of the first substrate to reveal the trench according to one aspect of the present embodiments.

Referring now to FIG. 13, removal of a portion of the first substrate to reveal the trench is shown according to one aspect of the present embodiments. A portion of the second side 806 of the first substrate 802 is removed to open the trench 808 and expose a portion 1334 of the lining 1014. Removal of the portion of the second side may be done through any suitable method (e.g. etching, cutting, polishing, grinding, etc.). It is understood that the removal of the portion of the second side 806 is controlled to expose the portion 1334 of the lining 1014 in the trench 808, while not exposing the lining 1014 in the second enclosure 1231. Thus, the second enclosure 1231 remains sealed.

Figure 14:
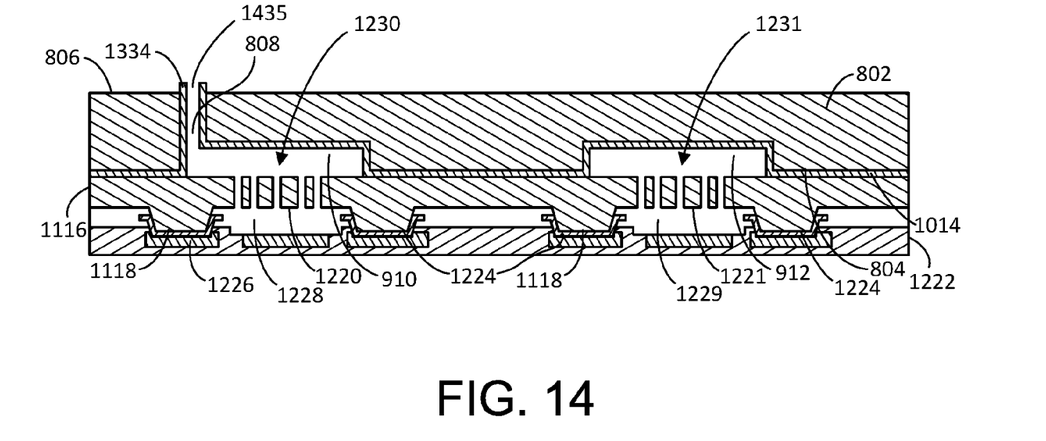
FIG. 14 shows removal of the exposed portion of the lining to reveal the trench and adjust the pressure in one cavity according to one aspect of the present embodiments.

Referring now to FIG. 14, removal of the exposed portion of the lining to reveal the trench and adjust the pressure in one cavity is shown according to one aspect of the present embodiments. The exposed portion 1334 of the lining 1014 (e.g oxide layer) is removed by any suitable method (e.g. etching, cutting, polishing, grinding, etc.), thereby creating an opening 1435 within the trench 808. In some embodiments, only a portion of the exposed portion 1334 of the lining 1014 is removed. For example, an oxide layer may line the trench, thereby forming a trench lining. An portion of the oxide layer may be exposed, thereby forming an exposed oxide portion of the trench lining. The entire exposed oxide portion of the trench lining or only a portion of the exposed oxide portion of the trench lining may then be removed.

As a result of the opening 1435, the pressure and/or environment within the first enclosure 1230 may be adjusted to a second predetermined state. For example, the chamber in which the post processing is being performed may be adjusted to increase or decrease the ambient pressure, thereby causing the pressure in the first enclosure 1230 to match the altered ambient pressure. Likewise, the chamber in which the post processing is being performed may be adjusted to increase or decrease levels of gas (e.g. helium, hydrogen, etc.), thereby causing the gas levels in the first enclosure 1230 to match the altered ambient gas composition.

While the environment within the first enclosure 1230 is being adjusted, the second enclosure 1231 remains sealed. As a result, different MEMS devices with different internal environments may be created on the same MEMS wafer. Some of the advantages include reducing process steps, speeding up fabrication, and allowing different MEMS devices to be more closely integrated. For example, an accelerometer may optimally function in a higher pressure environment (e.g. greater than 50 millibar). In addition, a gyroscope may optimally function in lower pressure environments (e.g. less than 8 millibar). Embodiments allow fabrication of both the accelerometer and the gyroscope using shared process steps.

Figure 15:
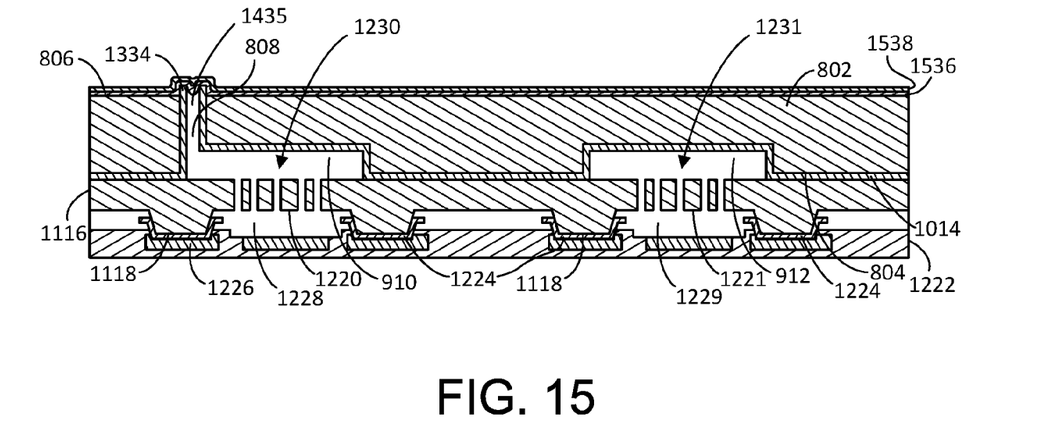
FIG. 15 shows the addition of seals to set the adjusted pressure of the trench cavity according to one aspect of the present embodiments.

Referring now to FIG. 15, the addition of seals to set the adjusted pressure of the trench cavity is shown according to one aspect of the present embodiments. A first seal layer 1536 (i.e. oxide layer) and a second seal layer 1538 are formed over the second side 806 of the first substrate 802 using any suitable fabrication method (e.g. deposition, growth, sputtering, etc.). The first seal layer 1536 and the second seal layer 1538 cover the opening 1435, thereby sealing the trench 808 and the first enclosure 1230. In various embodiments, the first seal layer 1536 and the second seal layer 1538 hermetically seal the trench 808 and the first enclosure 1230.

For example, an oxide seal may be deposited by chemical vapor deposition on the second side 806 of the substrate 802. In addition, a metal layer (e.g. AlCu) may be deposited by physical vapor deposition on the oxide seal. The metal and oxide layers trap the gas within the trench 808 and the first enclosure 1230, thereby locking in the environment surrounding the corresponding MEMS device. It is understood that the metal layer and oxide layer are exemplary and not limiting. In other embodiments, the oxide layer may overlay the metal layer. In further embodiments, seals other than metal and oxides may be used. In some embodiments, one layer or more than two layers may be used as seals.

In the illustrated embodiment, the first seal layer 1536 and the second seal layer 1538 cover the entire second side 806 of the first substrate 802. However in some embodiments, the first seal layer 1536 and the second seal layer 1538 may cover only portions of the second side 806. For example, the first seal layer 1536 and the second seal layer 1538 may only cover the opening 1435 and an area of the second side 806 surrounding the opening 1435. Thus the first seal layer 1536 and the second seal layer 1538 may be selectively applied in discrete areas to seal the trench 808 and the first enclosure 1230.

As previously stated, the arrangement of enclosures with and without trenches is not limited. As a result, a number of combinations of MEMS devices may be fabricated using the described embodiments. For example, MEMS devices requiring a first environment may be fabricated directly next to each other, or they may be separated by one or more MEMS devices requiring a second environment. Thus, many different combinations of MEMS devices may be fabricated, and should not be limited by the embodiments described herein.

In embodiments where the metal layer is in direct contact with the second side 806, the metal layer advantageously provides an EMC shield. In addition, in embodiments including the metal layer, the seal quality is advantageously improved.

Figure 16:
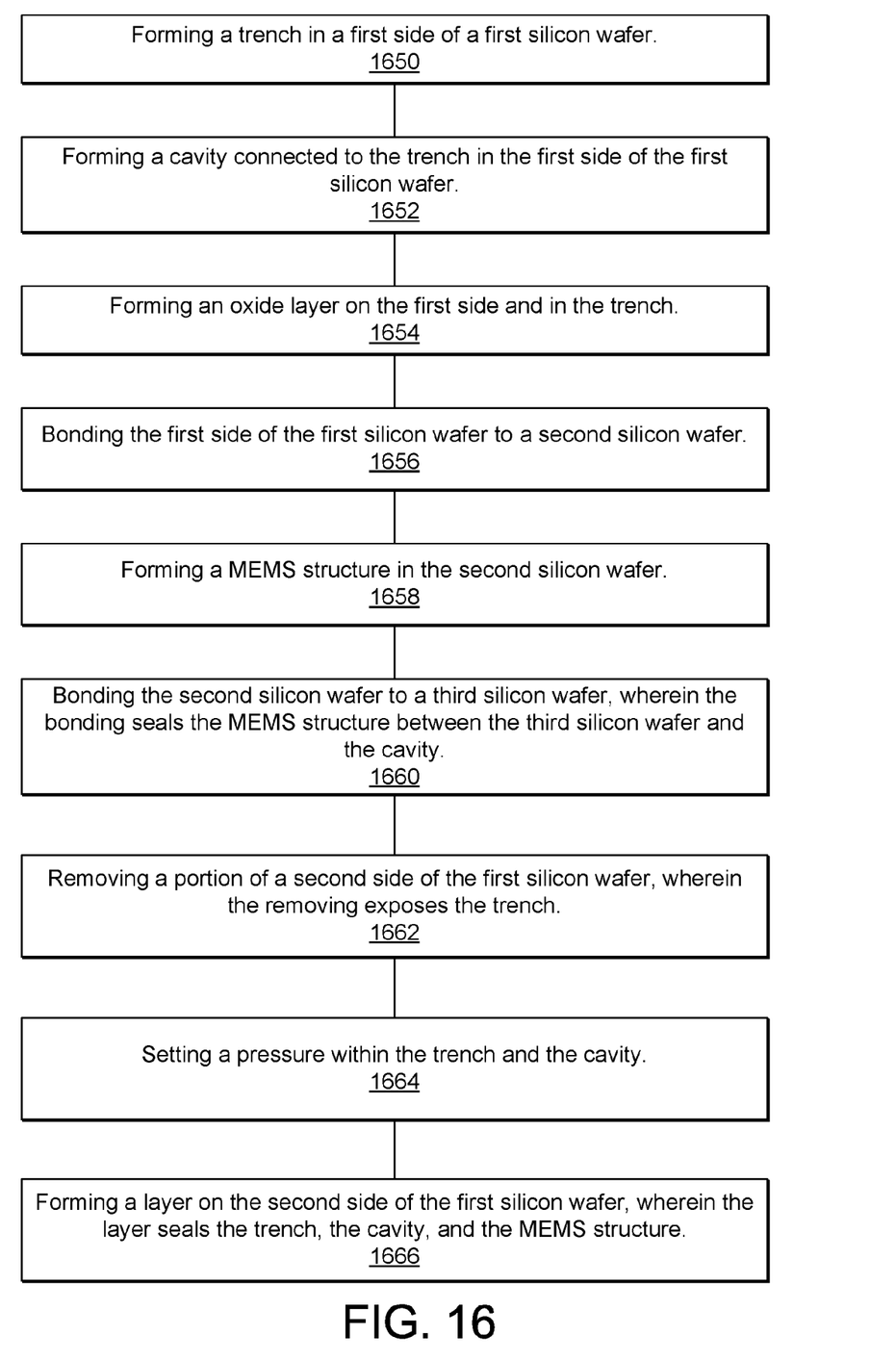
FIG. 16 shows an exemplary flow diagram for setting a pressure within a trench and cavity according to one aspect of the present embodiments.

FIG. 16 an exemplary flow diagram for setting a pressure within a trench and cavity is shown according to one aspect of the present embodiments. At a block 1650, a trench is formed in a first side of a first silicon wafer. For example, in FIG. 1 a trench is formed in the first side of the first substrate by any suitable fabrication method (e.g. etching, cutting, laser ablation, etc.).

At a block 1652, a cavity connected to the trench is formed in the first side of the first silicon wafer. For example, in FIG. 2 a first cavity is formed in the first side of the first substrate by any suitable fabrication method (e.g. etching, cutting, laser ablation, etc.). The first cavity is connected to the trench.

In some embodiments, an additional cavity is formed in the first side of the silicon wafer. For example, in FIG. 2 a second cavity 212 is formed in the first side of the first substrate by any suitable fabrication method (e.g. etching, cutting, laser ablation, etc.). In some embodiments, the additional cavity in the first side of the first silicon wafer includes a different pressure from the pressure within the trench and the cavity. For example, in FIG. 6 while the environment within the first enclosure is being adjusted, the second enclosure remains sealed. As a result, different MEMS devices with different internal environments may be created on the same MEMS wafer.

At a block 1654, an oxide layer is formed on the first side and in the trench. For example, in FIG. 3 a lining is formed over the first side using any suitable fabrication method (e.g. deposition, growth, sputtering, etc.). In some embodiments, the lining may be a thermal oxide growth (e.g. silicon dioxide) that reduces the width of the trench. For example, in FIG. 3 the lining may be used to set or reduce the width of the trench to 0.5 to 2.0 microns.

At a block 1656, the first side of the first silicon wafer is bonded to a second silicon wafer. For example, in FIG. 4 a second substrate is bonded to the first substrate.

At a block 1658, a MEMS structure is formed in the second silicon wafer. For example, in FIG. 5 first MEMS features are formed in the second substrate using any suitable fabrication method. Fabrication methods may include, but are not limited to, etching, cutting, laser ablation, deposition, growth, sputtering, etc. In some embodiments, an additional MEMS structure is formed in the second silicon wafer. For example, in FIG. 5 second MEMS features have been formed in the second substrate using any suitable fabrication method.

In some embodiments, a standoff is formed on the second silicon wafer. For example, in FIG. 4 standoffs are patterned on the second substrate. The standoffs define the vertical clearance between the structural layer and an IC substrate, as well as providing electrical contact between the structural layer and the IC substrate.

At a block 1660, the second silicon wafer is bonded to a third silicon wafer, wherein the bonding seals the MEMS structure between the third silicon wafer and the cavity. For example, in FIG. 5 the second substrate has been bonded to a third substrate with a eutectic bond, thereby sealing a first enclosure. The first enclosure is the fully enclosed volume surrounding the first MEMS features, including the first cavity and the first lower cavity.

In some embodiments, the bonding the second silicon wafer to the third silicon wafer provides a hermetic seal and an electrical connection. For example, in FIG. 5 the eutectic bond is a seal that may be a hermetic seal. In addition, the eutectic bond provides an electrical connection between the second substrate and the third substrate. In further embodiments, the bonding the second silicon wafer to the third silicon wafer includes forming an aluminum-germanium bond. For example, in FIG. 5 the eutectic bond may be an aluminum-germanium (AlGe) bond.

At a block 1662, a portion of a second side of the first silicon wafer is removed, wherein the removing exposes the trench. For example, in FIG. 6 a portion of the second side of the first substrate is removed to open the trench.

In some embodiments, a lining is formed within the trench, which reduces the width of the trench. For example, in FIG. 3 a lining is formed over the first side using any suitable fabrication method (e.g. deposition, growth, sputtering, etc.), and the formation of the lining reduces the width of the trench. In further embodiments, the removal of the portion of the second side of the first silicon wafer exposes a portion of the lining, and the exposed portion of the lining is removed. For example, in FIG. 14 the exposed portion of the lining is removed by any suitable method (e.g. etching, cutting, polishing, grinding, etc.), thereby creating an opening within the trench.

At a block 1664, a pressure is set within the trench and the cavity. For example, in FIG. 6 the pressure and/or environment within the first enclosure is adjusted to a second predetermined state. In some embodiments, the oxide layer is permeable to a gas, and setting the pressure within the trench and the cavity includes passing the gas through the oxide layer. For example, in FIG. 6 the portion of the lining is permeable to various gasses. As a result of the permeability of the portion of the lining, the pressure and/or environment within the first enclosure may be adjusted to a second predetermined state.

At a block 1666, a layer is formed on the second side of the first silicon wafer, wherein the layer seals the trench, the cavity, and the MEMS structure. For example, in FIG. 7 a seal layer is formed over the second side of the first substrate using any suitable fabrication method (e.g. deposition, growth, sputtering, etc.).

Figure 17:
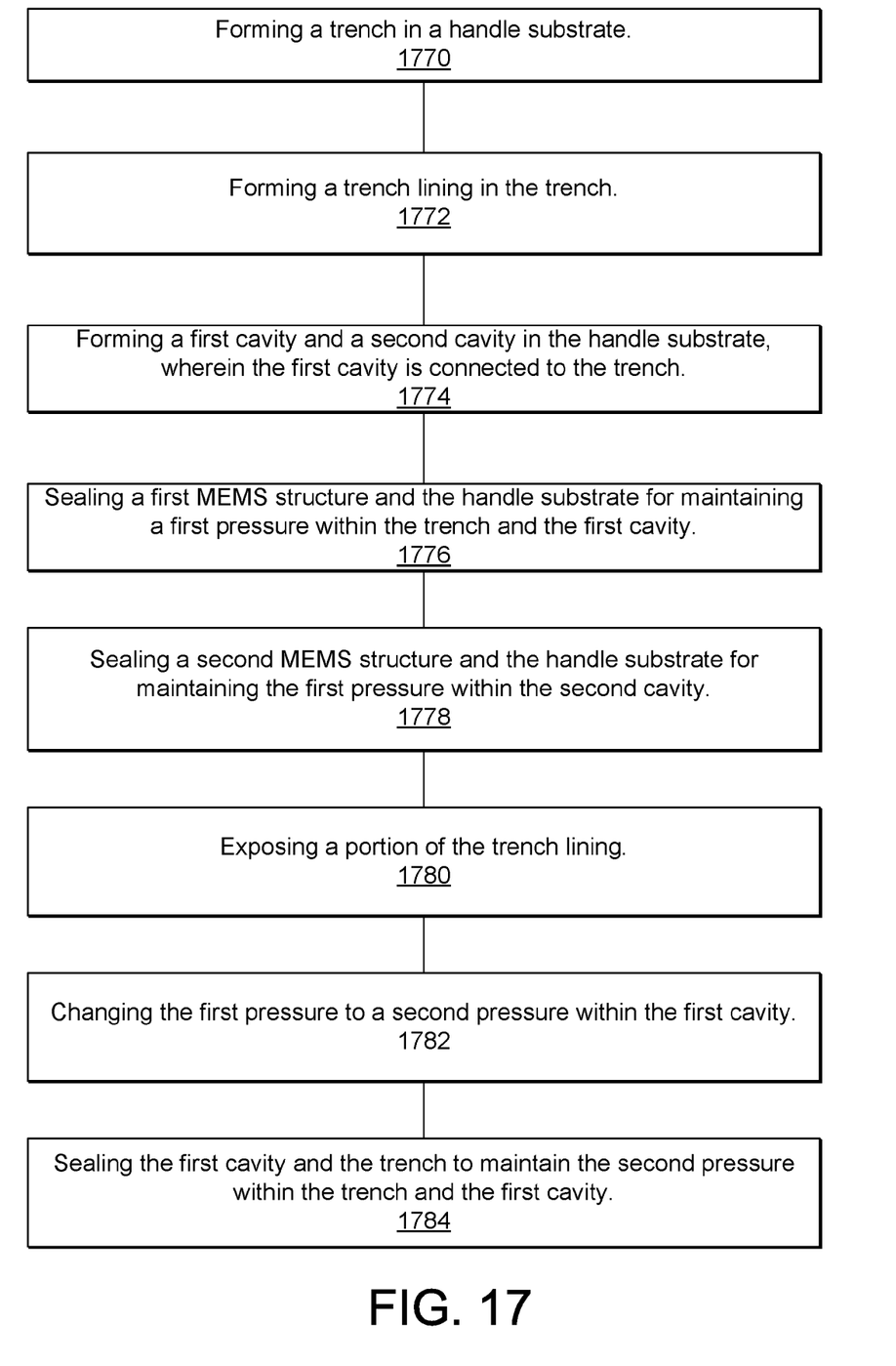
FIG. 17 shows an exemplary flow diagram for sealing a first pressure in a second cavity and sealing a second pressure in a first cavity according to one aspect of the present embodiments.

FIG. 17 an exemplary flow diagram for sealing a first pressure in a second cavity and sealing a second pressure in a first cavity is shown according to one aspect of the present embodiments. At a block 1770, a trench is formed in a handle substrate. For example, in FIG. 8 a trench is formed in the first side of the first substrate by any suitable fabrication method (e.g. etching, cutting, laser ablation, etc.). The first substrate provides mechanical support for the structural layer and may be referred to as a handle substrate or handle wafer. In some embodiments, the handle substrate serves as a cap to the structural layer.

At a block 1772, a trench lining is formed in the trench. For example, in FIG. 10 a lining is formed over the first side and may be a thermal oxide growth (e.g. silicon dioxide). The lining covers the first side, the trench, the first cavity, and the second cavity. In some embodiments, the width of the trench is 2 to 4 microns before the forming the trench lining, and the width of the trench is 0.5 to 2.0 microns after the forming the trench lining. For example, in FIG. 8 the width of the trench may be 2 to 4 microns, and in FIG. 10 the width of the trench after the formation of the lining may be 0.5 to 2.0 microns.

At a block 1774, a first cavity and a second cavity are formed in the handle substrate, wherein the first cavity is connected to the trench. For example, in FIG. 9 a first cavity and a second cavity (also referred to as upper cavities) are formed in the first side of the first substrate (also referred to as a handle substrate) by any suitable fabrication method (e.g. etching, cutting, laser ablation, etc.). The first cavity is connected to the trench.

At a block 1776, a first MEMS structure and the handle substrate are sealed for maintaining a first pressure within the trench and the first cavity. For example, in FIG. 12 MEMS features have been formed in the second substrate using any suitable fabrication method. In addition, the bonding of the second substrate to the third substrate seals a predetermined pressure and/or environment within the trench and first cavity. The MEMS structure is within the first cavity, and the first cavity includes a side opposite the MEMS structure. The trench is connected to the side of the cavity opposite the MEMS structure, and the trench is not directly opposite the MEMS structure.

At a block 1778, a second MEMS structure and the handle substrate are sealed for maintaining the first pressure within the second cavity. For example, in FIG. 12 the bonding of the second substrate to the third substrate seals a predetermined pressure and/or environment within the second cavity containing the MEMS features.

At a block 1780, a portion of the trench lining is exposed. For example, in FIG. 13 a portion of the second side of the first substrate is removed to open the trench and expose a portion of the lining. In some embodiments, the exposed portion of the trench lining or a portion of the exposed portion of the trench lining is removed. For example, in FIG. 14 the exposed portion of the lining is removed by any suitable method (e.g. etching, cutting, polishing, grinding, etc.), thereby creating an opening within the trench.

In other embodiments, the exposed portion of the lining is not removed. Instead the trench lining is permeable to a gas, and changing the first pressure to a second pressure within the first cavity includes passing the gas through the trench lining. For example, in FIG. 6 the portion of the lining is permeable to one or more gasses (e.g. helium and/or hydrogen). As a result of the permeability of the portion of the lining, the pressure and/or environment within the first enclosure may be adjusted to a second predetermined state.

At a block 1782, the first pressure is changed to a second pressure within the first cavity. For example, in FIG. 14 the pressure and/or environment within the first enclosure may be adjusted to a second predetermined state.

At a block 1784, the first cavity and the trench are sealed to maintain the second pressure within the trench and the first cavity. For example, in FIG. 15 a first seal layer and a second seal layer are formed over the second side of the first substrate using any suitable fabrication method (e.g. deposition, growth, sputtering, etc.). In some embodiments, the sealing includes depositing a metal layer over the trench lining. For example, in FIG. 15, a metal layer (e.g. AL or AlCu) may be deposited by physical vapor deposition on the oxide seal. The metal and oxide layers trap the gas within the trench and the first enclosure, thereby locking in the environment surrounding the corresponding MEMS device.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A method comprising:
forming a trench in a first side of a first silicon wafer;
forming a cavity connected to the trench in the first side of the first silicon wafer;
forming an oxide layer on the first side and in the trench;
bonding the first side of the first silicon wafer to a second silicon wafer;
forming a MEMS (micro-electro-mechanical systems) structure in the second silicon wafer;
bonding the second silicon wafer to a third silicon wafer;
removing a portion of a second side of the first silicon wafer, wherein the removing exposes the oxide layer;
setting a pressure within the trench and the cavity; and
forming a layer on the second side of the first silicon wafer, wherein the layer seals the trench, the cavity, and the MEMS structure.

2. The method of claim 1, wherein the bonding the second silicon wafer to the third silicon wafer includes eutectic bonding between the second silicon wafer and the third silicon wafer.

3. The method of claim 1, further comprising forming an additional cavity in the first side of the first silicon wafer.

4. The method of claim 3, wherein the additional cavity in the first side of the first silicon wafer includes a different pressure from the pressure within the trench and the cavity.

5. The method of claim 1, further comprising forming an additional MEMS structure in the second silicon wafer.

6. The method of claim 1, wherein the bonding the second silicon wafer to the third silicon wafer provides a hermetic seal and an electrical connection.

7. The method of claim 1, wherein the bonding the second silicon wafer to the third silicon wafer includes forming an aluminum-germanium bond.

8. The method of claim 1, wherein
the oxide layer is permeable to a gas, and
the setting the pressure within the trench and the cavity includes passing the gas through the oxide layer.

9. The method of claim 1,
wherein the oxide layer reduces the width of the trench, and wherein further the removing the portion of the second side of the first silicon wafer exposes a portion of the oxide layer; and
further comprising removing a portion of the exposed portion of the oxide layer.

10. A method comprising:
forming a trench in a handle substrate;
forming a trench lining in the trench;
forming a first cavity and a second cavity in the handle substrate, wherein the first cavity is connected to the trench;
sealing a first MEMS structure and the handle substrate for maintaining a first pressure within the trench and the first cavity;
sealing a second MEMS structure and the handle substrate for maintaining the first pressure within the second cavity;
exposing a portion of the trench lining;
changing the first pressure to a second pressure within the first cavity; and
sealing the first cavity and the trench to maintain the second pressure within the trench and the first cavity.

11. The method of claim 10, further comprising removing a portion of the exposed portion of the trench lining.

12. The method of claim 10, wherein forming the trench lining includes growing silicon dioxide.

13. The method of claim 10, wherein
the width of the trench is 2 to 4 microns before the forming the trench lining, and
the width of the trench is 0.5 to 2.0 microns after the forming the trench lining.

14. The method of claim 10, wherein the sealing includes depositing a metal layer over the trench lining.

15. The method of claim 10, wherein
the trench lining is permeable to a gas, and
the changing the first pressure to a second pressure within the first cavity includes passing the gas through the trench lining.

16. The method of claim 10, wherein the gas is helium or hydrogen.

* * * * *